United States Patent
Chang et al.

(10) Patent No.: US 9,040,361 B2
(45) Date of Patent: May 26, 2015

(54) CHIP SCALE PACKAGE WITH ELECTRONIC COMPONENT RECEIVED IN ENCAPSULANT, AND FABRICATION METHOD THEREOF

(75) Inventors: Chiang-Cheng Chang, Taichung (TW); Chien-Ping Huang, Taichung (TW); Chun-Chi Ke, Taichung (TW); Hsin-Yi Liao, Taichung (TW); Hsi-Chang Hsu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 250 days.

(21) Appl. No.: 12/959,148

(22) Filed: Dec. 2, 2010

(65) Prior Publication Data

US 2012/0038044 A1    Feb. 16, 2012

(30) Foreign Application Priority Data

Aug. 12, 2010  (TW) ............................... 99126869 A (51) Int. Cl.
| | |
|---|---|
| *H01L 23/31* | (2006.01) |
| *H01L 21/58* | (2006.01) |
| *H01L 23/00* | (2006.01) |
| *H01L 25/10* | (2006.01) |

(52) U.S. Cl.
CPC ............ *H01L 24/82* (2013.01); *H01L 23/3128* (2013.01); *H01L 24/19* (2013.01); *H01L 24/20* (2013.01); *H01L 24/24* (2013.01); *H01L 24/25* (2013.01); *H01L 24/32* (2013.01); *H01L 24/73* (2013.01); *H01L 25/105* (2013.01); *H01L 2224/12105* (2013.01); *H01L 2224/24225* (2013.01); *H01L 2224/25171* (2013.01); *H01L 2224/32155* (2013.01); *H01L 2224/73267* (2013.01); *H01L 2225/1058* (2013.01); *H01L 2924/01029* (2013.01); *H01L 2924/01082* (2013.01); *H01L 2924/15311* (2013.01); *H01L 2924/01033* (2013.01); *H01L 2924/014* (2013.01); *H01L 2224/32225* (2013.01); *H01L 2225/1035* (2013.01); *H01L 2924/3511* (2013.01); *H01L 2224/92244* (2013.01)

(58) Field of Classification Search
CPC ..................................................... H01L 25/117
See application file for complete search history.

(56) References Cited

U.S. PATENT DOCUMENTS

| | | |
|---|---|---|
| 5,892,179 A | 4/1999 | Rinne et al. |
| 6,103,552 A | 8/2000 | Lin |

(Continued)

*Primary Examiner* — Stephen W Smoot
(74) *Attorney, Agent, or Firm* — Mintz Levin Cohn Ferris Glovsky and Popeo, P.C.; Peter F. Corless; Steven M. Jensen (57) ABSTRACT

A CSP includes: a hard board having a first wiring layer with conductive pads; a plurality of conductive elements disposed on at least a portion of the conductive pads; an electronic component having opposite active and inactive surfaces and being mounted on the hard board via the inactive surface; an encapsulating layer disposed on the hard board for encapsulating the conductive elements and electronic component, the active surface of the electronic component and the surfaces of the conductive elements being exposed through the encapsulating layer; a first dielectric layer and a third wiring layer disposed on the encapsulating layer, the third wiring layer being electrically connected to the conductive elements and the electronic component and further electrically connected to the first wiring layer through the conductive elements, thereby obtaining a stacked connection structure without the need of PTHs and using the hard board as a main structure to avoid warpage.

23 Claims, 6 Drawing Sheets

(56) References Cited

U.S. PATENT DOCUMENTS

| | | | |
|---|---|---|---|
| 6,159,767 A * | 12/2000 | Eichelberger | 438/107 |
| 6,271,469 B1 | 8/2001 | Ma et al. | |
| 6,287,893 B1 | 9/2001 | Elenius et al. | |
| 6,350,668 B1 | 2/2002 | Chakravorty | |
| 6,376,769 B1 * | 4/2002 | Chung | 174/524 |
| 6,433,427 B1 | 8/2002 | Wu et al. | |
| 6,586,922 B2 | 7/2003 | Saeki et al. | |
| 7,019,406 B2 | 3/2006 | Huang et al. | |
| 7,190,080 B1 * | 3/2007 | Leu et al. | 257/778 |
| 7,238,602 B2 | 7/2007 | Yang | |
| 7,241,645 B2 * | 7/2007 | Zhao et al. | 438/122 |
| 7,553,743 B2 * | 6/2009 | Lee | 438/455 |
| 7,619,901 B2 * | 11/2009 | Eichelberger et al. | 361/763 |
| 7,830,000 B2 * | 11/2010 | Eichelberger et al. | 257/706 |
| 7,880,275 B2 * | 2/2011 | Pagaila et al. | 257/659 |
| 7,910,385 B2 * | 3/2011 | Kweon et al. | 438/18 |
| 8,018,036 B2 * | 9/2011 | Goh et al. | 257/676 |
| 8,026,608 B2 * | 9/2011 | Sabatini et al. | 257/758 |
| 8,093,703 B2 * | 1/2012 | Kim et al. | 257/686 |
| 8,093,711 B2 * | 1/2012 | Zudock et al. | 257/698 |
| 8,110,916 B2 * | 2/2012 | Weng et al. | 257/693 |
| 8,133,762 B2 * | 3/2012 | Pagaila et al. | 438/117 |
| 8,188,585 B2 * | 5/2012 | Brunnbauer et al. | 257/686 |
| 8,193,624 B1 * | 6/2012 | Sohn | 257/686 |
| 8,216,918 B2 * | 7/2012 | Gong et al. | 438/464 |
| 2002/0020898 A1 * | 2/2002 | Vu et al. | 257/676 |
| 2002/0185734 A1 * | 12/2002 | Zhao et al. | 257/737 |
| 2004/0113284 A1 * | 6/2004 | Zhao et al. | 257/782 |
| 2005/0205978 A1 * | 9/2005 | Pu et al. | 257/678 |
| 2006/0175697 A1 * | 8/2006 | Kurosawa et al. | 257/686 |
| 2007/0034998 A1 * | 2/2007 | Huang et al. | 257/678 |
| 2007/0080447 A1 * | 4/2007 | Hasebe et al. | 257/706 |
| 2007/0235871 A1 * | 10/2007 | Huang et al. | 257/737 |
| 2007/0290376 A1 * | 12/2007 | Zhao et al. | 257/787 |
| 2008/0036065 A1 * | 2/2008 | Brunnbauer et al. | 257/686 |
| 2008/0136004 A1 * | 6/2008 | Yang et al. | 257/686 |
| 2008/0174008 A1 * | 7/2008 | Yang et al. | 257/723 |
| 2008/0224306 A1 * | 9/2008 | Yang | 257/725 |
| 2008/0237879 A1 * | 10/2008 | Yang | 257/774 |
| 2008/0303174 A1 * | 12/2008 | Pan et al. | 257/777 |
| 2008/0313894 A1 * | 12/2008 | Fillion et al. | 29/840 |
| 2009/0127686 A1 * | 5/2009 | Yang et al. | 257/686 |
| 2009/0302478 A1 * | 12/2009 | Pagaila et al. | 257/774 |
| 2010/0044845 A1 * | 2/2010 | Funaya et al. | 257/685 |
| 2010/0072588 A1 | 3/2010 | Yang | |
| 2010/0072599 A1 * | 3/2010 | Camacho et al. | 257/686 |
| 2010/0072606 A1 | 3/2010 | Yang | |
| 2010/0078655 A1 | 4/2010 | Yang | |
| 2010/0237481 A1 * | 9/2010 | Chi et al. | 257/685 |
| 2010/0244208 A1 * | 9/2010 | Pagaila et al. | 257/659 |
| 2010/0244240 A1 * | 9/2010 | Kapusta et al. | 257/737 |
| 2010/0252921 A1 * | 10/2010 | Katagiri | 257/692 |
| 2010/0289126 A1 * | 11/2010 | Pagaila et al. | 257/659 |
| 2010/0301470 A1 * | 12/2010 | Gurrum et al. | 257/713 |
| 2011/0127678 A1 * | 6/2011 | Shim et al. | 257/773 |
| 2011/0140247 A1 * | 6/2011 | Pagaila et al. | 257/659 |
| 2011/0147911 A1 * | 6/2011 | Kohl et al. | 257/686 |
| 2011/0193217 A1 * | 8/2011 | Meyer-Berg | 257/734 |

* cited by examiner

CHIP SCALE PACKAGE WITH ELECTRONIC COMPONENT RECEIVED IN ENCAPSULANT, AND FABRICATION METHOD THEREOF

CROSS-REFERENCES TO RELATED APPLICATIONS

This application claims under 35 U.S.C. §119(a) the benefit of Taiwanese Application No. 099126869, filed Aug. 12, 2010, the entire contents of which is incorporated herein by reference.

BACKGROUND OF THE INVENTION

1. Field of the Invention

The present invention relates generally to semiconductor packages and fabrication methods thereof, and more particularly, to a chip scale package (CSP) and a fabrication method thereof.

2. Description of Related Art

A chip scale package is characterized in that the package size is equivalent to the size of the chip that is disposed in the package. U.S. Pat. No. 5,892,179, U.S. Pat. No. 6,103,552, U.S. Pat. No. 6,287,893, U.S. Pat. No. 6,350,668 and U.S. Pat. No. 6,433,427 disclose a conventional CSP structure, wherein a build-up structure is directly formed on a chip without using a chip carrier, such as a substrate or a lead frame, and a redistribution layer (RDL) technique is used to accomplish a redistribution of the electrode pads of the chip to a desired pattern.

However, the application of the RDL technique or disposing of conductive traces on the chip is limited by the size of the chip or the area of the active surface of the chip. Particularly, as chips are developed towards high integration and compact size, they do not have enough surface area for mounting of more solder balls for electrical connection to an external device.

Accordingly, U.S. Pat. No. 6,271,469 provides a fabrication method of a wafer level chip scale package (WLCSP), wherein a build-up layer is formed on the chip of the package so as to provide enough surface area for disposing I/O terminals or solder balls.

Figure 1A:
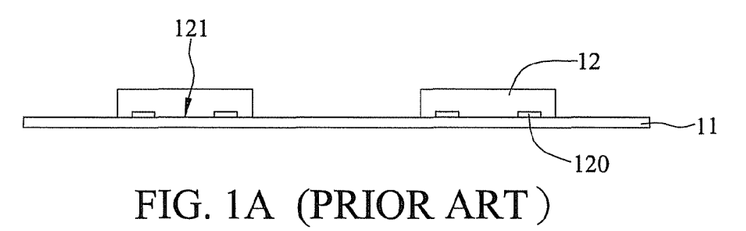
FIGS. 1A to 1C are cross-sectional views showing a fabrication method of a wafer level chip scale package according to U.S. Pat. No. 6,271,469.
Figure 1B:
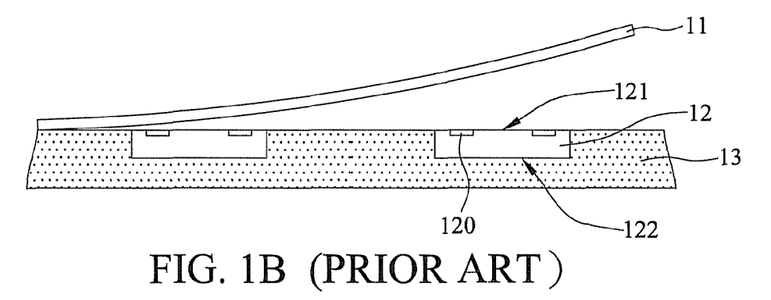
Figure 1C:
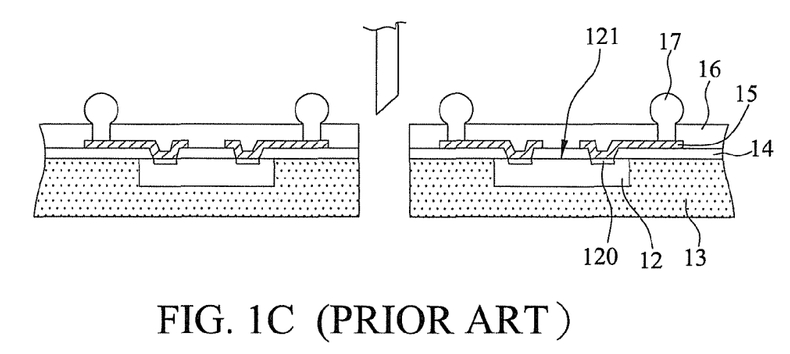

Referring to FIG. 1A, an adhesive film 11 is prepared, and a plurality of chips 12, each having an active surface 121 and an opposite inactive surface 122, is provided and attached to the adhesive film 11 via the active surfaces 121 thereof, respectively. Therein, the adhesive film 11 can be such as a heat-sensitive adhesive film. Referring to FIG. 1B, a molding process is performed to form an encapsulant 13 such as an epoxy resin encapsulating the inactive surfaces 122 and side surfaces of the chips 12. Then, the adhesive film 11 is removed by heating so as to expose the active surfaces 121 of the chips 12. Referring to FIG. 1C, by using an RDL technique, a dielectric layer 14 is formed on the active surfaces 121 of the chips 12 and the surface of the encapsulant 13 and a plurality of openings is formed in the dielectric layer 14 to expose the electrode pads 120 of the chips. Then, a wiring layer 15 is formed on the dielectric layer 14 and electrically connected to the electrode pads 120. A solder mask layer 16 with a plurality of openings is further formed on the wiring layer 15, and solder balls 17 are mounted on the wiring layer 15 in the openings of the solder mask layer 16. Subsequently, a singulation process is performed to obtain a plurality of packages.

In the above-described packages, the surface of the encapsulant 13 encapsulating the chip 12 is larger than the active surface 121 of the chip 12 and therefore allows more solder balls 17 to be mounted thereon for electrically connecting to an external device.

However, since the chip 12 is fixed by being attached to the adhesive film 11, deviation of the chip 12 can easily occur due to film-softening and extension caused by heat, especially in the molding process, thus adversely affecting the electrical connection between the electrode pads 120 of the chip 12 and the wiring layer 15 during the subsequent RDL process.

Figure 2:
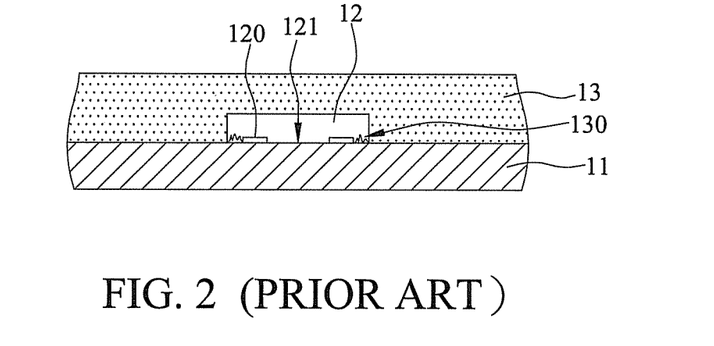
FIG. 2 is a cross-sectional view showing encapsulant overflow of the package.

Referring to FIG. 2, since the adhesive film 11 is softened by heat in the molding process, overflow 130 of the encapsulant 13 can easily occur to the active surface 121 of the chip 12 and even contaminate the electrode pads 120 of the chip 12, thus resulting in poor electrical connection between the electrode pads of the chip and subsequently formed wiring layer and even causing product failure.

Figure 3A:
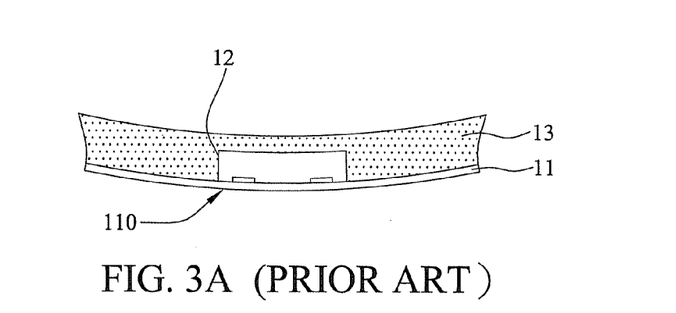
FIG. 3A is a cross-sectional view showing warpage of the package.
Figure 3B:
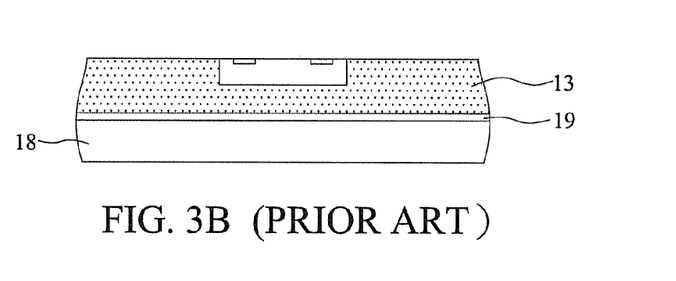
FIG. 3B is a cross-sectional view showing application of a hard carrier to the package.
Figure 3C:
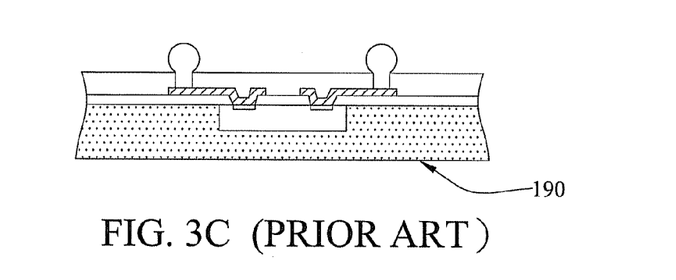
FIG. 3C is a cross-sectional view showing the problem of adhesive residue of the package.

Referring to FIG. 3A, since the adhesive film 11 supports a plurality of chips 12, warpage 110 can easily occur to the adhesive film 11 and the encapsulant 13, especially when the encapsulant 13 has a small thickness. As such, the thickness of the dielectric layer formed on the chip during the RDL process is not uniform. To overcome this drawback, a hard carrier 18 as shown in FIG. 3B is required so as for the encapsulant 13 to be secured thereto through an adhesive 19, which however complicates the process and increases the fabrication cost. Further, when the RDL process is completed and the hard carrier 18 is removed, some adhesive residue 190 may be left on the encapsulant, as shown in FIG. 3C. Related techniques are disclosed in U.S. Pat. No. 6,498,387, U.S. Pat. No. 6,586,822, U.S. Pat. No. 7,019,406 and U.S. Pat. No. 7,238,602.

In addition, since a WLCSP generally comprises only one chip 12, it has quite limited electrical function. Accordingly, package on package (POP) structures with improved electrical function are proposed. However, such a structure requires plated through holes (PTHs) to achieve interlayer connections, as disclosed by US Patent Application No. 20100072588, No. 20100072606 and No. 20100078655, thus complicating the fabrication process and increasing the fabrication cost.

Therefore, it is imperative to provide a chip scale package and a fabrication method thereof so as to ensure the electrical connection quality between the chip electrode pads and the wiring layer of the package, improve the product reliability, reduce the fabrication cost and allow other semiconductor packages to be stacked without the need of PTHs.

SUMMARY OF THE INVENTION

In view of the above-described drawbacks, the present invention provides a chip scale package, which comprises: a hard board having a first surface and an opposite second surface, wherein a first wiring layer and a second wiring layer are respectively disposed on the first surface and the second surface and are electrically connected to each other, and the first wiring layer has a plurality of conductive pads; a plurality of conductive elements disposed on at least a portion of the conductive pads; an electronic component having an active surface with a plurality of electrode pads thereon and an inactive surface opposite to the active surface and being mounted on the first surface of the hard board via the inactive surface thereof; an encapsulating layer formed on the first surface of the hard board for encapsulating the conductive elements and the electronic component, the active surface of the electronic component and the surfaces of the conductive elements being exposed from the encapsulating layer; a first dielectric layer formed on the encapsulating layer and having a plurality of openings for exposing the electrode pads of the active surface of the electronic component and the surfaces of the conductive elements; and a third wiring layer formed on the first dielectric layer so as to be electrically connected to the conductive elements and the electrode pads.

In the above-described chip scale package, the electronic component can be a chip or a passive component. The conductive elements can be solder balls, pins, stud bumps or metal pillars. The package can further comprise a die attach film disposed between the inactive surface of the electronic component and the first surface of the hard board so as to allow the electronic component to be attached to the first surface. The encapsulating layer can be made of ajinomoto build-up film (ABF), polyimide (PI) or polymerized siloxanes (silicone).

The package can further comprise a first solder mask layer formed on the first dielectric layer and the third wiring layer and having a plurality of openings for exposing a portion of the third wiring layer. Furthermore, a semiconductor package can be mounted on the exposed portion of the third wiring layer via a plurality of first solder balls. The chip scale package can further comprise a second solder mask layer formed on the second surface and the second wiring layer and having a plurality of openings for exposing a portion of the second wiring layer. Furthermore, a semiconductor package can be mounted on the exposed portion of the second wiring layer via a plurality of second solder balls.

According to another embodiment, a build-up structure is disposed on the first dielectric layer and the third wiring layer, and a first solder mask layer is further formed on the build-up structure.

The present invention further provides a fabrication method of a chip scale package, which comprises the steps of: providing a hard board having a first surface and an opposite second surface, wherein a first wiring layer and a second wiring layer are respectively disposed on the first surface and the second surface and are electrically connected to each other, and the first wiring layer has a plurality of conductive pads; forming a plurality of conductive elements on at least a portion of the conductive pads; forming an encapsulating layer on the first surface of the hard board to encapsulate the conductive elements; disposing an electronic component on the encapsulating layer, the electronic component having an active surface with a plurality of electrode pads thereon and an inactive surface opposite to the active surface; pressing the electronic component and the hard board so as to attach the inactive surface of the electronic component to the hard board, the active surface of the electronic component and the surfaces of the conductive elements being exposed from the encapsulating layer; and sequentially forming a first dielectric layer and a third wiring layer on the encapsulating layer, the third wiring layer being electrically connected to the conductive elements and the electrode pads.

Therein, the conductive elements can be solder balls, pins, stud bumps or metal pillars. The encapsulating layer can be made of ABF, polyimide or polymerized siloxanes. The inactive surface of the electronic component can be attached to the first surface of the hard board through a die attach film. A portion of the encapsulating layer can be removed by laser so as to expose the active surface of the electronic component and the surfaces of the conductive elements.

The fabrication method can further comprise forming a first solder mask layer on the first dielectric layer and the third wiring layer and forming a plurality of openings in the first solder mask layer for exposing a portion of the third wiring layer. Furthermore, first solder balls can be mounted on the exposed portion of the third wiring layer according to practical needs. In addition, a second solder mask layer can be formed on the second surface and the second wiring layer and a plurality of openings can be formed in the second solder mask layer for exposing a portion of the second wiring layer.

The fabrication method can further comprise mounting a semiconductor package on the exposed portion of the second wiring layer via a plurality of second solder balls or mounting a semiconductor package on the exposed portion of the third wiring layer via a plurality of first solder balls.

According to another embodiment, a build-up structure is formed on the first dielectric layer and the third wiring layer. Further, a first solder mask layer and a plurality of solder balls can be formed on the build-up structure according to practical needs.

Therefore, the present invention mainly involves forming conductive elements on conductive pads of a first wiring layer of a hard board; forming an encapsulating layer on the hard board to encapsulate the conductive elements; disposing an electronic component on the encapsulating layer and pressing the electronic component and the hard board so as to attach the inactive surface of the electronic component to the hard board and removing a portion of the encapsulating layer by laser to expose the surfaces of the conductive elements and the active surface of the electronic component; and sequentially forming a first dielectric layer and a third wiring layer on the encapsulating layer. Therein, the third wiring layer is electrically connected to the conductive elements and the electronic component and further electrically connected to the first wiring layer through the conductive elements so as to eliminate the need of PTHs. Furthermore, a solder mask layer can be formed on either side of the hard board and solder balls can be mounted in the openings of the solder mask layer so as to allow another semiconductor package to be mounted thereon, thus obtaining a stacked package structure.

In addition, the present invention uses the hard board as a main structure and a wiring layer and a solder mask layer can be formed on both surfaces of the hard board so as to avoid warpage of the structure, thereby increasing the product reliability and reducing the fabrication cost.

DETAILED DESCRIPTION OF PREFERRED EMBODIMENTS

The following illustrative embodiments are provided to illustrate the disclosure of the present invention, these and other advantages and effects can be apparent to those in the art after reading this specification.

Figure 4A:
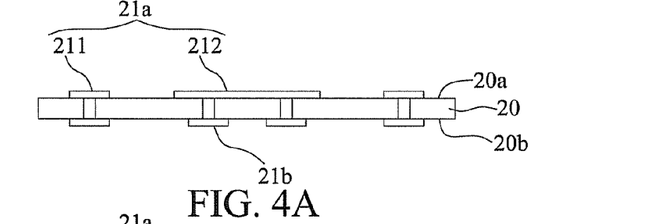
FIGS. 4A to 4F are cross-sectional views showing a chip scale package and a fabrication method thereof according to the present invention, wherein FIG. 4C' shows another embodiment of FIG. 4C, and FIG. 4F' shows another embodiment of FIG. 4F.
Figure 4B:
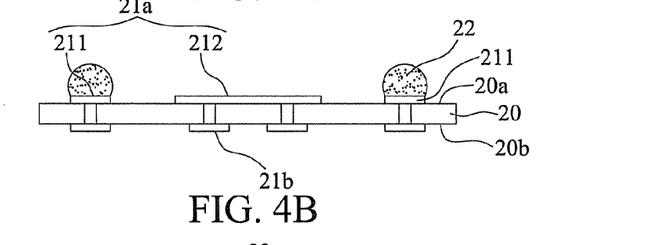
Figure 4C:
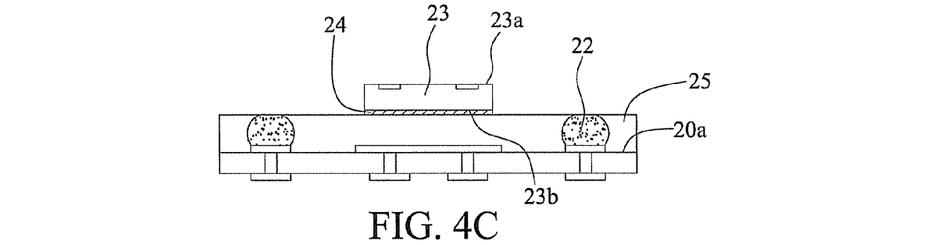
Figure 4D:
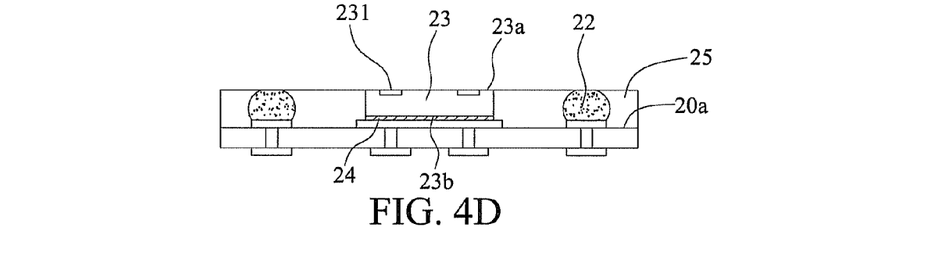
Figure 4E:
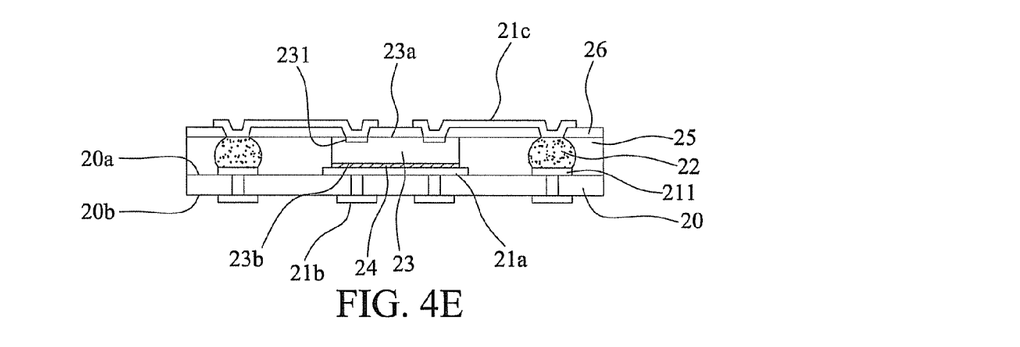
Figure 4F:
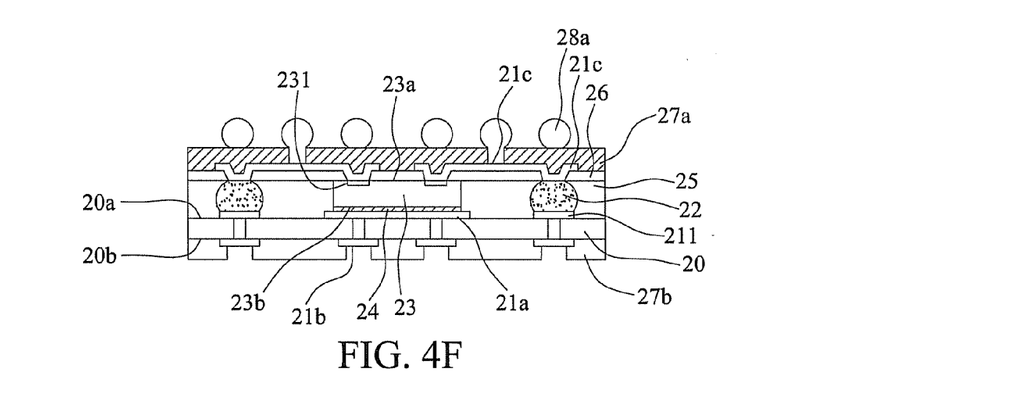

FIGS. 4A to 4F are cross-sectional views showing a fabrication method of a chip scale package according to the present invention, wherein FIG. 4F' is another embodiment of FIG. 4F.

Referring to FIG. 4A, a hard board 20 having a first surface 20a and an opposite second surface 20b is provided, which can be made of a copper clad laminate (CCL) with two or more layers. A first wiring layer 21a and a second wiring layer 21b are respectively disposed on the first surface 20a and the second surface 20b of the hard board 20 and electrically connected to each other. The first wiring layer 21a has a plurality of conductive pads 211 and at least a heat dissipation pad 212 for dissipating heat of an electronic component subsequently mounted thereon.

Referring to FIG. 4B, a plurality of conductive elements 22, such as solder balls, pins, stud bumps or metal pillars, is formed on at least a portion of the conductive pads 211. Therein, the solder balls or stud bumps can be mounted on the conductive pads 211 through surface mounting technology (SMT); pins or stud bumps can be directly formed on the conductive pads 211 through a pin mounting machine or a wire bonding machine; and metal pillars made of nickel or copper can be formed on the conductive pads 211 through electroplating or deposition.

Referring to FIG. 4C, an encapsulating layer 25 made of ABF, polyimide or polymerized siloxanes is formed on the first surface 20a of the hard board 20 to encapsulate the conductive elements 22. An electronic component 23 such as a chip or a passive component is disposed on the encapsulating layer 25. Therein, the electronic component 23 has an active surface 23a with a plurality of electrode pads 231 and an inactive surface 23b opposite to the active surface 23a. In addition, the inactive surface 23b of the electronic component 23 has a die attach film 24 disposed thereon. Alternatively, referring to FIG. 4C', the electronic component 23 is directly disposed on the encapsulating layer 25.

Referring to FIG. 4D, the encapsulating layer 25 is heated and then the electronic component 23 and the hard board 20 are pressed so as to allow the electronic component 23 to be encapsulated by the encapsulating layer 25 and attach the inactive surface 23b of the electronic component 23 to the hard board 20, i.e., the heat dissipation pad. Further, a portion of the encapsulating layer 25 is removed by laser so as to expose the surfaces of the conductive elements 22 and the active surface 23a of the electronic component 23.

Referring to FIG. 4E, a first dielectric layer 26 and a third wiring layer 21c are formed on the encapsulating layer 25, and the third wiring layer 21c is electrically connected to the conductive elements 22 and the electrode pads 231 and further electrically connected to the first wring layer 21a through the conductive elements 22. As such, the present invention eliminates the need of conventional plated through holes (PTHs) for interlayer electrical connections.

Referring to FIG. 4F, a first solder mask layer 27a is formed on the first dielectric layer 26 and the third wiring layer 21c and a plurality of openings is formed in the first solder mask layer 27a to expose a portion of the third wiring layer 21c; and a plurality of first solder balls 28a are mounted on the exposed portion of the third wiring layer 21c so as to electrically connect to the third wiring layer 21c. Furthermore, a second solder mask layer 27b can be formed on the second surface 20b and the second wiring layer 21b and a plurality of openings can be formed in the second solder mask layer 27b to expose a portion of the second wiring layer 21b, thus allowing another semiconductor package to be mounted on the exposed portion of the second wiring layer 21b.

Alternatively, referring to FIG. 4F', a build-up structure 29 is formed on the first dielectric layer 26 and the third wiring layer 21c, wherein the build-up structure 29 comprises a second dielectric layer 29a and a fourth wiring layer 29b formed on the second dielectric layer 29a. Further, a first solder mask layer 27a is formed on the build-up structure 29 and a plurality of openings is formed in the first solder mask layer 27a to expose a portion of the fourth wiring layer 29b; and a plurality of first solder balls 28a are implanted on the exposed portion of the fourth wiring layer 29b so as to electrically connect to the fourth wiring layer 29b. The structure of the second surface 20b and the second wiring layer 21b are similar to that in FIG. 4F and detailed description thereof is omitted herein.

Figure 5A:
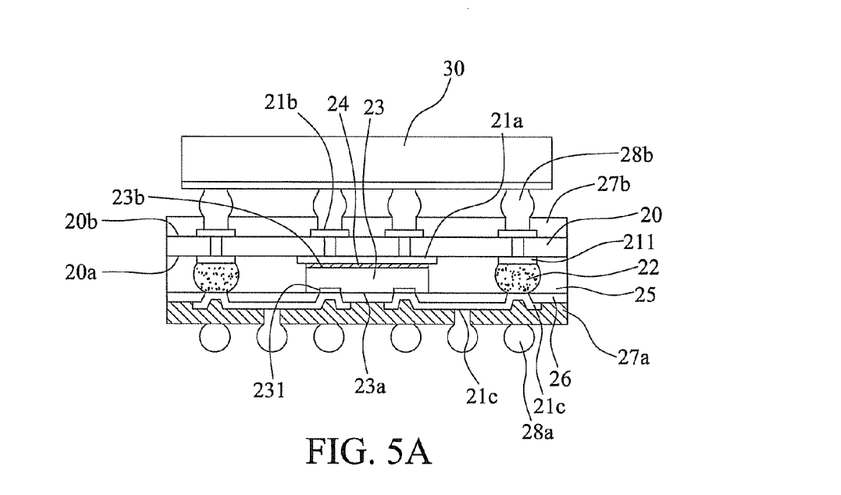
FIGS. 5A and 5B are cross-sectional views showing a chip scale package with another semiconductor package stacked thereon according to the present invention.
Figure 5B:
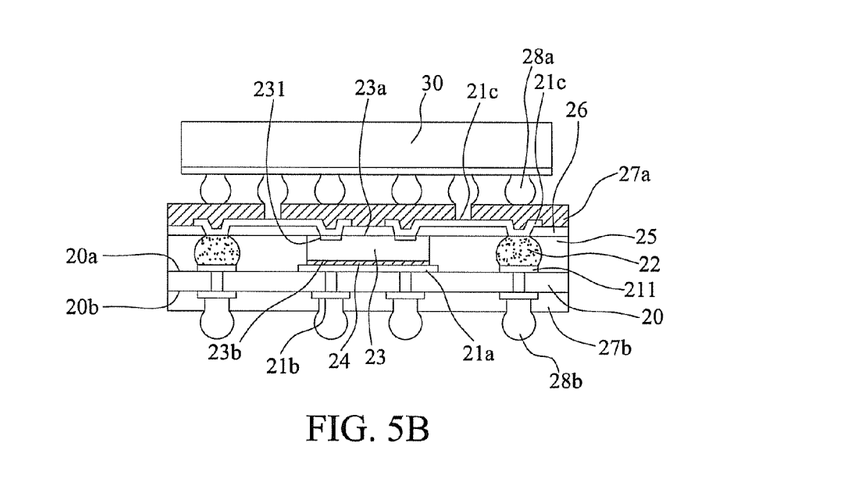

Referring to FIG. 5A, a semiconductor package 30 is mounted on the exposed portion of the second wiring layer 21b via a plurality of second solder balls 28b so as to obtain a stacked package structure. Alternatively, referring to FIG. 5B, a semiconductor package is mounted on the exposed portion of the third wiring layer 21c via a plurality of first solder balls 28a. Meanwhile, the stacked structure can comprise a plurality of second solder balls 28b disposed on the exposed portion of the second wiring layer 21b.

The present invention further provides a chip scale package, which has: a hard board 20 having a first surface 20a and an opposite second surface 20b, wherein a first wiring layer 21a and a second wiring layer 21b are respectively disposed on the first surface 20a and the second surface 20b and electrically connected to each other, and the first wiring layer 21a has a plurality of conductive pads 211; a plurality of conductive elements 22 disposed on at least a portion of the conductive pads 211; an electronic component 23 having an active surface 23a with a plurality of electrode pads 231 and an inactive surface 23b opposite to the active surface 23a and mounted on the first surface 20a of the hard board 20 via the inactive surface 23a thereof; an encapsulating layer 25 formed on the first surface 20a of the hard board 20 for encapsulating the conductive elements 22 and the electronic component 23, the active surface 23a of the electronic component 23 and the surfaces of the conductive elements 22 being exposed from the encapsulating layer 25; a first dielectric layer 26 formed on the encapsulating layer 25 and having a plurality of openings for exposing the surfaces of the conductive elements 22 and the electrode pads 231 on the active surface 23a of the electronic component 23; and a third wiring layer 21c formed on the first dielectric layer 26 so as to be electrically connected to the conductive elements 22 and the electrode pads 231.

Therein, the conductive elements 22 can be solder balls, pins, stud bumps or metal pillars.

The electronic component 23 can be mounted on a heat dissipation pad 212 of the first wiring layer 21a via the inactive surface 23b thereof.

The encapsulating layer 25 can be made of ABF, polyimide or polymerized siloxanes.

The above-described chip scale package can further comprise a die attach film 24 disposed between the inactive surface 23b of the electronic component 23 and the first surface 20a of the hard board 20 so as to allow the electronic component 23 to be attached to the first surface 20a.

The chip scale package can further comprise a first solder mask layer 27a formed on the first dielectric layer 26 and the third wiring layer 21c and having a plurality of openings for exposing a portion of the third wiring layer 21c; and a plurality of first solder balls 28a mounted on the exposed portion of the third wiring layer 21c.

Alternatively, the chip scale package can comprise a build-up structure 29 disposed on the first dielectric layer 26 and the third wiring layer 21c; a first solder mask layer 27a formed on the build-up structure 20; and a plurality of first solder balls 28a mounted in the openings of the first solder mask layer 27a so as to electrically connect to the build-up structure 29.

The chip scale package can further comprise a second solder mask layer 27b formed on the second surface 20b and the second wiring layer 21b and having a plurality of openings for exposing a portion of the second wiring layer 21b; and a plurality of second solder balls 28b mounted on the exposed portion of the second wiring layer 21b.

Furthermore, the chip scale package can comprise a semiconductor package 30 mounted on the exposed portion of the second wiring layer 21b via the second solder balls 28b so as to obtain a chip scale package with stacked structure.

Therefore, the present invention mainly involves forming conductive elements on conductive pads of a first wiring layer of a hard board; forming an encapsulating layer on the hard board to encapsulate the conductive elements; disposing an electronic component on the encapsulating layer and pressing the electronic component and the hard board so as to attach the inactive surface of the electronic component to the hard board and removing a portion of the encapsulating layer by laser to expose the surfaces of the conductive elements and the active surface of the electronic component; and sequentially forming a first dielectric layer and a third wiring layer on the encapsulating layer. Therein, the third wiring layer is electrically connected to the conductive elements and the electronic component and further electrically connected to the first wiring layer through the conductive elements so as to eliminate the need of PTHs. Furthermore, a solder mask layer can be formed on either side of the hard board and solder balls can be mounted in the openings of the solder mask layer so as to allow another semiconductor package to be mounted thereon, thus obtaining a stacked package structure.

In addition, the present invention uses the hard board as a main structure and a wiring layer and a solder mask layer can be formed on both surfaces of the hard board so as to avoid warpage of the structure, thereby increasing the product reliability and reducing the fabrication cost.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:
1. A chip scale package, comprising:
  a copper clad laminate (CCL) hard board having a first surface and an opposite second surface, wherein a first wiring layer and a second wiring layer are respectively only formed on the first surface and the second surface and are electrically connected to each other, and the first wiring layer has a plurality of conductive pads;
  a plurality of conductive elements disposed on at least a portion of the conductive pads;
  an electronic component having an active surface with a plurality of electrode pads thereon and an inactive surface opposite to the active surface and being mounted on the first surface of the hard board via the inactive surface thereof;
  a single encapsulating layer formed on the first surface of the hard board for encapsulating the conductive elements and the electronic component, the active surface of the electronic component and surfaces of the conductive elements being exposed from the encapsulating layer, wherein the active surface of the electronic component is flush with a surface of the encapsulating layer;
  a first dielectric layer formed on the encapsulating layer and having a plurality of openings for exposing the electrode pads on the active surface of the electronic component and the surfaces of the conductive elements; and
  a single third wiring layer formed on the first dielectric layer so as to be in contact with and electrically connected to the conductive elements and the electrode pads.

2. The package of claim 1, wherein the conductive elements are solder balls, pins, stud bumps or metal pillars.

3. The package of claim 1, further comprising a die attach film disposed between the inactive surface of the electronic component and the first surface of the hard board so as to allow the electronic component to be attached to the first surface.

4. The package of claim 1, wherein the first wiring layer further comprises a heat dissipation pad, and the electronic component is mounted on the heat dissipation pad via the inactive surface thereof.

5. The package of claim 1, wherein the encapsulating layer is made of polyimide or polymerized siloxanes.

6. The package of claim 1, further comprising a first solder mask layer formed on the first dielectric layer and the third wiring layer and having a plurality of openings for exposing a portion of the third wiring layer.

7. The package of claim 6, further comprising a semiconductor package mounted on the exposed portion of the third wiring layer via a plurality of first solder balls.

8. The package of claim 1, further comprising a second solder mask layer formed on the second surface and the second wiring layer and having a plurality of openings for exposing a portion of the second wiring layer.

9. The package of claim 8, further comprising a semiconductor package mounted on the exposed portion of the second wiring layer via a plurality of second solder balls.

10. The package of claim 1, further comprising a build-up structure disposed on the first dielectric layer and the third wiring layer.

11. The package of claim 10, further comprising a first solder mask layer formed on the build-up structure.

12. A fabrication method of a chip scale package, comprising the steps of:
  providing a hard board having a first surface and an opposite second surface, wherein a first wiring layer and a second wiring layer are respectively disposed on the first surface and the second surface and are electrically connected to each other, and the first wiring layer has a plurality of conductive pads;
  forming a plurality of conductive elements on at least a portion of the conductive pads;
  forming an encapsulating layer on the first surface of the hard board to encapsulate the conductive elements;
  disposing an electronic component on the encapsulating layer, the electronic component having an active surface with a plurality of electrode pads thereon and an inactive surface opposite to the active surface;
  pressing the electronic component and the hard board so as to attach the inactive surface of the electronic component to the hard board, the active surface of the electronic component and surfaces of the conductive elements being exposed from the encapsulating layer; and sequentially forming a first dielectric layer and a third wiring layer on the encapsulating layer, the third wiring layer being electrically connected to the conductive elements and the electrode pads.

13. The method of claim 12, wherein the conductive elements are solder balls, pins, stud bumps or metal pillars.

14. The method of claim 12, wherein the inactive surface of the electronic component is attached to the first surface of the hard board through a die attach film.

15. The method of claim 12, wherein the encapsulating layer is made of polyimide or polymerized siloxanes.

16. The method of claim 12, wherein a portion of the encapsulating layer is removed by laser so as to expose the active surface of the electronic component and the surfaces of the conductive elements.

17. The method of claim 12, wherein the first wiring layer further comprises a heat dissipation pad, and the electronic component is mounted on the heat dissipation pad via the inactive surface thereof.

18. The method of claim 12, further comprising forming a first solder mask layer on the first dielectric layer and the third wiring layer and forming a plurality of openings in the first solder mask layer for exposing a portion of the third wiring layer.

19. The method of claim 18, further comprising mounting a semiconductor package on the exposed portion of the third wiring layer via a plurality of first solder balls.

20. The method of claim 12, further comprising forming a second solder mask layer on the second surface and the second wiring layer and forming a plurality of openings in the second solder mask layer for exposing a portion of the second wiring layer.

21. The method of claim 20, further comprising mounting a semiconductor package on the exposed portion of the second wiring layer via a plurality of second solder balls.

22. The method of claim 12, further comprising forming a build-up structure on the first dielectric layer and the third wiring layer.

23. The method of claim 22, further comprising forming a first solder mask layer on the build-up structure.

* * * * *